United States Patent
Lien et al.

(10) Patent No.: US 10,348,337 B2
(45) Date of Patent: Jul. 9, 2019

(54) DATA READ METHOD AND MEMORY STORAGE DEVICE USING THE SAME

(71) Applicant: Winbond Electronics Corp., Taichung (TW)

(72) Inventors: Chuen-Der Lien, San Jose, CA (US); Ming-Huei Shieh, San Jose, CA (US); Chi-Shun Lin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/441,161

(22) Filed: Feb. 23, 2017

(65) Prior Publication Data

US 2018/0239533 A1    Aug. 23, 2018

(51) Int. Cl.
- *G11C 29/00* (2006.01)
- *H03M 13/00* (2006.01)
- *H03M 13/37* (2006.01)
- *G06F 11/10* (2006.01)

(52) U.S. Cl.
CPC ..... *H03M 13/6502* (2013.01); *G06F 11/1048* (2013.01); *H03M 13/3715* (2013.01)

(58) Field of Classification Search
CPC ........ G06F 3/061; G06F 3/0619; G06F 3/064; G06F 3/0659; G06F 3/0673; G06F 11/1076; H03M 13/3715; H03M 13/6502
See application file for complete search history.

(56) References Cited

U.S. PATENT DOCUMENTS

| | | | |
|---|---|---|---|
| 8,495,467 B1 * | 7/2013 | Billing | G11C 29/42 714/764 |
| 8,572,465 B2 | 10/2013 | Uchikawa et al. | |
| 9,213,602 B1 * | 12/2015 | Alhussien | G06F 11/1068 |
| 9,912,355 B2 * | 3/2018 | Motwani | H03M 13/2906 |
| 2004/0153902 A1 | 8/2004 | Machado et al. | |
| 2014/0245098 A1 * | 8/2014 | Sharon | G06F 11/1012 714/755 |

FOREIGN PATENT DOCUMENTS

CN    101447227    3/2012

* cited by examiner

Primary Examiner — Samir W Rizk
(74) Attorney, Agent, or Firm — JCIPRNET

(57) ABSTRACT

A data read method for a memory storage device is provided. The data read method includes: receiving a first read command from a host system for reading first data; calculating an error bit number of the first data; and performing a correction of the first data. If the error bit number is not greater than a predetermined number, finishing the correction of the first data and returning the corrected first data at a pre-defined timing. If the error bit number is greater than a predetermined number, finishing the correction of the first data and returning the corrected first data after the pre-defined timing. In addition, a memory storage device using the data read method is also provided.

15 Claims, 1 Drawing Sheet

DATA READ METHOD AND MEMORY STORAGE DEVICE USING THE SAME

BACKGROUND OF THE INVENTION

1. Field of the Invention

The invention relates to a memory storage device, and more particularly, relates to a data read method and a memory storage device using the data read method.

2. Description of Related Art

Generally, data to be written to a rewritable non-volatile memory (NVM) may be encoded according to an error correcting codes (ECC). Data read from the rewritable non-volatile memory may also be processed by a corresponding decoding procedure. For improving reliability, multiple bits ECC scheme is widely used in the NVM technologies. However, it is noted that it takes much longer delay and more power to correct 2-bit or more bits comparing to mere 1-bit correction under the multiple bits ECC scheme.

Fortunately, two or more error bits barely exist in one read data in a present rewritable non-volatile memory. In light of the foregoing reason, it is unwise and consumptive to always perform full ECC calculation while it is only required in rare cases. Therefore, how to improve the efficiency when reading data under the multiple bits ECC scheme is one of the major subjects for person skilled in the art.

SUMMARY OF THE INVENTION

Accordingly, the invention is directed to a data read method and a memory storage device using the data read method. By adopting the data read method, the average read time may be reduced thus the system efficiency may be improved.

An exemplary embodiment of the invention provides a data read method for a memory storage device. The data read method includes: receiving a first read command from a host system for reading first data; calculating an error bit number of the first data; and performing a correction of the first data. If the error bit number is not greater than a predetermined number, finishing the correction of the first data and returning the corrected first data at a pre-defined timing. If the error bit number is greater than a predetermined number, finishing the correction of the first data and returning the corrected first data after the pre-defined timing.

Another exemplary embodiment of the present invention provides a memory storage device. The memory storage device includes a host interface, a memory array and a memory controller. The host interface is configured to be coupled to a host system. The memory controller is coupled to the host interface and the memory array. The memory controller receives a first read command from the host system for reading first data, calculates an error bit number of the first data, and performs a correction of the first data. If the error bit number is not greater than a predetermined number, the memory controller finishes the correction of the first data and returns the corrected first data to the host system at a pre-defined timing. If the error bit number is greater than a predetermined number, the memory controller finishes the correction of the first data and returns the corrected first data to the host system after the pre-defined timing.

Based on the above, by adopting the data read method and the memory storage device provided in the invention, read data is corrected and returned at a designated timing if an error bit number of the read data is not greater than a predetermined number. On the other hand, the read data is corrected and returned at a subsequent timing if the error bit number of the read data is greater than a predetermined number. Accordingly, the average read time may be reduced thus the system efficiency may be improved.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
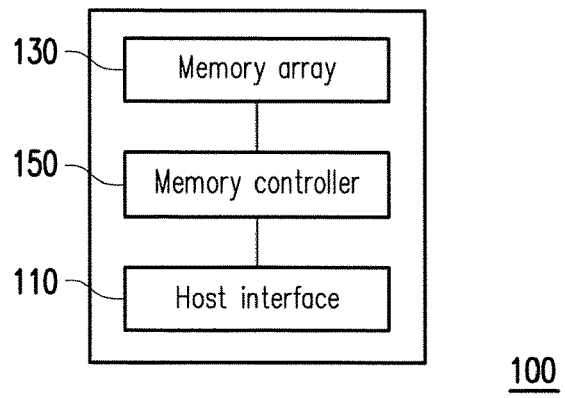
FIG. 1 is a block diagram illustrating a memory storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram illustrating a memory storage device according to an embodiment of the invention. Referring to FIG. 1, the memory storage device 100 includes a host interface 110, a memory array 130 and a memory controller 150. The memory controller 150 is coupled to the host interface 110 and the memory array 130. In the present embodiment, the memory storage device 100 is a non-volatile memory, used for storing data and being accessed by a host system.

The host interface 110 is coupled to the memory controller 150 and configured to couple to the host system. In the present embodiment, the host interface 110 is coupled to the host system for establishing a communication between the host system and the memory controller 150. In the present embodiment, the host interface 110 is compatible with a common flash memory interface (CFI) standard, but the invention is not limited thereto. In other embodiments, the host interface 110 may be compatible with a serial advanced technology attachment (SATA) standard, a peripheral component interconnect Express (PCI-E) interface standard, a universal serial bus (USB) standard, an integrated device electronics (IDE) interface standard or other suitable standards.

The memory array 130 is coupled to the memory controller 150 and includes a plurality of memory cells. In the present embodiment, the memory array 130 is configured to store data and be read and written by the host system.

The memory controller 150 is coupled to the host interface 110 and the memory array 130. In the present embodiment, the memory controller 150 receives a first read command from the host system for reading first data. The memory controller 150 may perform the data read method introduced in the invention for reading the first data correctly and effectively. It is noted that the memory controller 150 may be implemented in a form of hardware or firmware, and responsible for managing the overall operations of the memory storage device 100.

Figure 2:
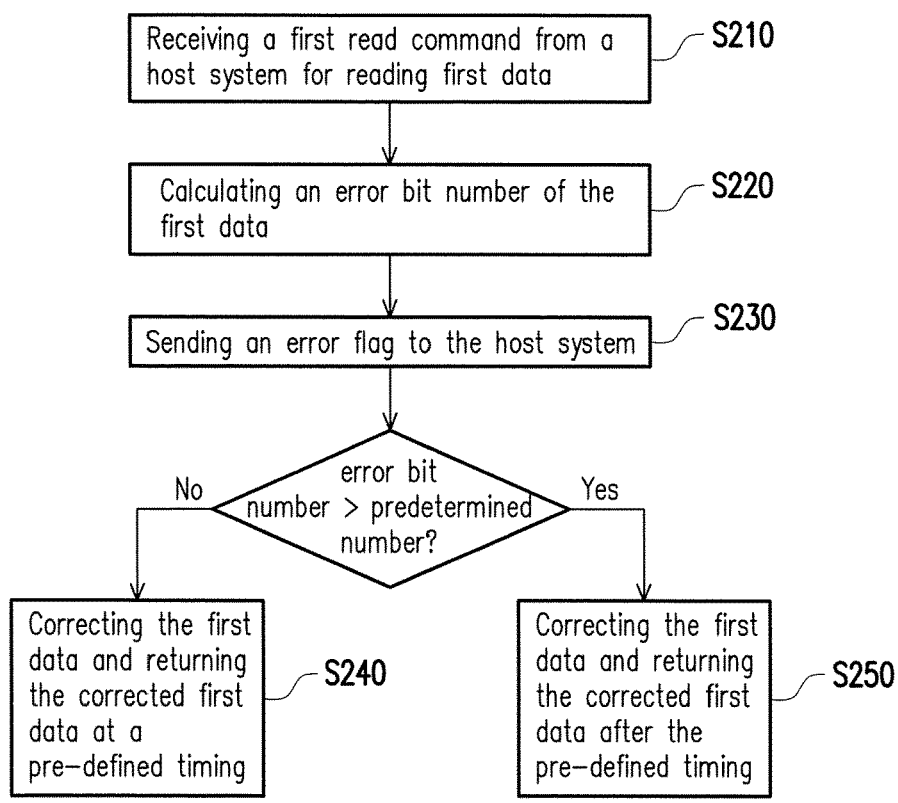
FIG. 2 is a flowchart illustrating a data read method according to an embodiment of the invention.

FIG. 2 illustrates a flowchart of a data read method according to an embodiment of the invention. The data read method may be performed by the memory storage device 100 of the embodiment of FIG. 1. Therefore, the data read method may be illustrated by referring to the aforementioned memory storage device 100 in the present embodiment.

In the present embodiment, the memory storage device 100 is adopting a multiple bits ECC scheme. For example, when the host system issues a read command to the memory controller 150, the memory controller 150 may retrieve data according to the read command from the memory array 130. For correctly returning the read data, the memory controller 150 may first detect and correct error bits of the data read by the host system. In the present embodiment, the memory controller 150 may detect and correct three error bits at most, but the invention is not limited thereto.

Referring to FIG. 2, in step S210, the memory controller 150 may receive a first read command from a host system for reading first data. In the present embodiment, the memory controller 150 may receive the first read command through the host interface 110. After receiving the first read command, the memory controller 150 may try to return the correct first data to the host system at a pre-defined timing according to the first read command. It is noted that the pre-defined timing may indicate a pre-defined system clock of a first frequency in the present embodiment, and the memory controller 150 may try to return the correct first data to the host system at the pre-defined system clock according to the received first read command, but which is not limited herein.

For returning the correct first data, in step S220, the memory controller 150 may calculate an error bit number of the first data. In the present embodiment, the memory controller 150 may first retrieve the first data from the memory array 130 by using a first sensing reference according to the first read command. The first sensing reference may be a voltage reference or a current reference. Then, the memory controller 150 may calculate the error bit number of the first data under a multiple bits ECC scheme. In the present embodiment, the memory controller 150 may detect the error bits of the first data without correcting them under a three-bit ECC scheme, and thus the error bit number of the first data may be obtained.

In step S230, the memory controller 150 may send an error flag to the host system. In the present embodiment, the memory controller 150 may first generate the error flag indicating the error bit number of the first data. After that, the memory controller 150 may send the generated error flag to the host system through the host interface 110. The generated error flag may be sent before the pre-defined timing or at the pre-defined timing, which is not limited herein.

In the present embodiment, once the host system receives the error flag, it may be notified whether to receive the first data returned from the memory storage device 100 at the pre-defined timing (e.g., pre-defined system clock). In detail, if the error bit number of the first data is not greater than a predetermined number, the memory controller 150 may correct the first data and return the corrected first data to the host system at the pre-defined timing in step S240. On the other hand, if the error bit number of the first data is greater than a predetermined number, the memory controller 150 may correct the first data and return the corrected first data to the host system after the pre-defined timing in step S250.

The predetermined number is preset according to the correction cost for correcting data read from the memory storage device 100. Briefly, when data is retrieved from the memory array 130 and to be corrected, the correction cost such as the calculation delay, area and the power consumption for correcting more than two bits of error is much higher than that for correcting only one-bit error. As a result, the predetermined number is preset as one in the present embodiment. However, the invention is not limited thereto.

In the present embodiment, if the read first data has no error or only has one error bit, in step S240, the memory controller 150 may directly correct the first data and return the corrected first data to the host system at the pre-defined timing (e.g., pre-defined system clock of the first frequency) with little cost of time or power. On the other hand, if the read first data has more than two bits of error, the error bits may not be corrected completely at the pre-defined system clock of the first frequency. Therefore, the read operation may be postponed so as to be performed during a period longer than period of the pre-defined system clock, or be performed by using a different sensing reference to reduce the error bit number in step S250. That is, the memory controller 150 may finish the correction of the first data and return the corrected first data after the pre-defined timing. Details of various implementations of the step S250 are illustrated in the following descriptions, but it should be known that which is not limited thereto.

In one embodiment, once the host system receives the error flag indicating two or more error bits existed in the first data, the host system may reduce the system frequency and issue another read command (i.e., second read command) to read the first data. Accordingly, after the memory controller 150 receives the second read command, it may correct the first data and return the corrected first data at a subsequent first system clock of a second frequency which is lower than the first frequency. The subsequent first system clock is subsequent to the pre-defined system clock.

It should be noted that, after the host system receives the first data returned from the memory storage device 100, the host system may resume the system frequency (i.e., first frequency) in some embodiments. For example, the host system may next issue a third read command for reading another data (i.e., second data). The memory controller 150 may receive the third read command and preform the data read method again according to the aforementioned embodiment. In detail, the memory controller 150 may correct the second data and return the corrected second data at a subsequent second system clock of the first frequency if the host system does not reduce the system frequency again, where the subsequent second system clock is subsequent to the subsequent first system clock.

Except for adjusting the system frequency, in another embodiment, the host system may also issue another read command (i.e., second read command) for reading the first data. Since the system frequency is not adjusted in the embodiment, the system frequency is still the first frequency. Accordingly, once the memory controller 150 receives the second read command for reading the first data, the memory controller 150 may correct the first data and return the corrected first data at at least two subsequent second system clocks of the first frequency. In this way, the first data with two or more error bits may also be corrected and returned in a longer period.

In still another embodiment, the host system may also issue another read command (i.e., second read command) for reading the first data. The memory controller 150 may receive the second read command, correct the first data and return the corrected first data. However, in the embodiment, the host system may provide at least one dummy clock for correcting the first data and returning the corrected first data by the memory controller 150. In other words, the memory controller 150 may correct the first data and return the corrected first data at a subsequent second system clock of the first frequency and at least one dummy clock of the first frequency after the pre-defined system clock in the embodiment.

As a result, the first data with two or more error bits may be corrected and returned in a period longer than period of the pre-defined system clock. It is noted that the invention is not limited herein. People having skills in the art may make appropriate modifications to the provided embodiments.

Moreover, in one embodiment, the memory controller 150 may try to reduce the error bit number of the read first data. For example, the host system may issue another read command (i.e., second read command) for reading the first data without adjusting the system frequency and the memory controller 150 may receive the second read command. According to the second read command, the memory controller 150 may retrieve the first data from the memory array 130 by using a second sensing reference, where the second sensing reference is different from the first sensing reference. For example, the first sensing reference may be a first voltage reference, and the second sensing reference may be a second voltage reference smaller than the first voltage reference if the error bit to be corrected has a logical value "1". In an alternative instance, the first sensing reference may be a first voltage reference, and the second sensing reference may be a second voltage reference larger than the first voltage reference if the error bit to be corrected has a logical value "0". By using a different sensing reference, the error bit number of the first data may be reduced so that the cost for correcting the first data may be reduced as well.

In summary, by adopting the data read method and the memory storage device provided in the invention, read data is corrected and returned at a designated timing if an error bit number of the read data is not greater than a predetermined number. On the other hand, the read data is corrected and returned at at least one subsequent timing if the error bit number of the read data is greater than the predetermined number. Accordingly, the average read time may be reduced and thus the system efficiency may be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data read method adapted for a memory controller of a memory storage device, comprising:
   receiving a first read command from a host system for reading first data;
   calculating an error bit number of the first data;
   comparing the error bit number of the first data to a predetermined number;
   performing a correction of the first data using a n-bit error-correction code (ECC) and returning the corrected first data to the host system during a period provided by a pre-defined clock if the error bit number is not greater than the predetermined number; and
   receiving a second read command from the host system for reading the first data, performing the correction of the first data using a m-bit ECC and returning the corrected first data to the host system after the period provided by the pre-defined clock if the error bit number is greater than the predetermined number, wherein n and m are integers, and n is smaller than m,
   wherein if the error bit number is greater than the predetermined number, the corrected first data is returned to the host system during a period provided by:
      a subsequent first system clock of a second frequency, wherein the second frequency is lower than the first frequency, and the subsequent first system clock is subsequent to the pre-defined system clock;
      at least two subsequent second system clocks of the first frequency, wherein the subsequent second system clock is subsequent to the pre-define system clock; or
      the subsequent second system clock of the first frequency and at least one dummy clock of the first frequency after the pre-defined system clock.

2. The data read method as claimed in claim 1, wherein the pre-defined clock is a pre-defined system clock, wherein a system frequency at the pre-define system clock is a first frequency.

3. The data read method as claimed in claim 1, wherein step of calculating the error bit number of the first data comprises:
   retrieving the first data by using a first sensing reference according to the first read command; and
   calculating the error bit number of the first data under a multiple bits ECC scheme.

4. A data read method adapted for a memory controller of a memory storage device, comprising:
   receiving a first read command from a host system for reading first data;
   calculating an error bit number of the first data, wherein step of calculating the error bit number of the first data comprises:
      retrieving the first data by using a first sensing reference according to the first read command; and
      calculating the error bit number of the first data under a multiple bits ECC scheme;
   comparing the error bit number of the first data to a predetermined number;
   performing a correction of the first data using a n-bit error-correction code (ECC) and returning the corrected first data to the host system during a period provided by a pre-defined clock if the error bit number is not greater than the predetermined number; and
   performing the correction of the first data using a m-bit ECC and returning the corrected first data to the host system after the period provided by the pre-defined clock if the error bit number is greater than the predetermined number, wherein n and m are integers, and n is smaller than m,
   wherein if the error bit number is greater than the predetermined number, the data read method further comprises:
      receiving a second read command from the host system for reading the first data; and
      retrieving the first data by using a second sensing reference according to the second read command, wherein the second sensing reference is different from the first sensing reference.

5. The data read method as claimed in claim 1, further comprising:

sending an error flag to the host system before the period provided by the pre-defined clock, wherein the error flag indicates the error bit number of the first data, wherein the host system receives the error flag and receives the first data after the period provided by the pre-defined clock according to the received error flag.

6. The data read method as claimed in claim 1, further comprising:
sending an error flag to the host system during the period provided by the pre-defined clock, wherein the error flag indicates the error bit number of the first data, wherein the host system receives the error flag and receives the first data after the period provided by the pre-defined clock according to the received error flag.

7. The data read method as claimed in claim 1, wherein the predetermined number is preset according to at least one correction cost for correcting data read from the memory storage device.

8. A memory storage device, comprising:
a host interface configured to couple to a host system;
a memory array; and
a memory controller coupled to the host interface and the memory array, wherein the memory controller receives a first read command from the host system for reading first data, calculates an error bit number of the first data, and compares the error bit number of the first data to a predetermined number,
the memory controller performs a correction of the first data using a n-bit error-correction code (ECC) and returns the corrected first data to the host system during a period provided by a pre-defined clock if the error bit number is not greater than the predetermined number, and
the memory controller performs the correction of the first data using a m-bit ECC and returns the corrected first data to the host system after the period provided by the pre-defined clock if the error bit number is greater than the predetermined number, wherein n and m are integers, and n is smaller than m,
wherein when the memory controller calculates the error bit number of the first data, the memory controller retrieves the first data by using a first sensing reference from the memory array according to the first read command, and calculates the error bit number of the first data under a multiple bits ECC scheme,
wherein if the error bit number is greater than the predetermined number, the memory controller receives a second read command from the host system for reading the first data, and further retrieves the first data by using a second sensing reference according to the second read command, wherein the second sensing reference is different from the first sensing reference.

9. The memory storage device as claimed in claim 8, wherein the pre-defined clock is a pre-defined system clock, wherein a system frequency at the pre-define system clock is a first frequency.

10. The memory storage device as claimed in claim 9, wherein if the error bit number is greater than the predetermined number,
the memory controller returns the corrected first data at a subsequent first system clock of a second frequency, wherein the second frequency is lower than the first frequency, and the subsequent first system clock is subsequent to the pre-defined system clock.

11. The memory storage device as claimed in claim 9, wherein if the error bit number is greater than the predetermined number,
the memory controller returns the corrected first data at at least two subsequent second system clocks of the first frequency, wherein the subsequent second system clock is subsequent to the pre-define system clock.

12. The memory storage device as claimed in claim 9, wherein if the error bit number is greater than the predetermined number,
the memory controller returns the corrected first data at a subsequent second system clock of the first frequency and at least one dummy clock of the first frequency after the pre-defined system clock.

13. The memory storage device as claimed in claim 8, wherein the memory controller further generates an error flag indicating the error bit number of the first data, and sends the error flag to the host system before the period provided by the pre-defined clock, wherein the host system receives the error flag and receives the first data after the period provided by the pre-defined clock according to the received error flag.

14. The memory storage device as claimed in claim 8, wherein the memory controller further generates an error flag indicating the error bit number of the first data, and sends the error flag to the host system during the period provided by the pre-defined clock, wherein the host system receives the error flag and receives the first data after the period provided by the pre-defined clock according to the received error flag.

15. The memory storage device as claimed in claim 8, the predetermined number is preset according to at least one correction cost for correcting data read from the memory storage device.

\* \* \* \* \*